United States Patent [19]

Morel et al.

[11] Patent Number: 4,517,403

[45] Date of Patent: May 14, 1985

[54] SERIES CONNECTED SOLAR CELLS AND METHOD OF FORMATION

[75] Inventors: Don L. Morel, Woodland Hills; Robert R. Gay, Granada Hills; Gary B. Turner, Canoga Park, all of Calif.

[73] Assignee: Atlantic Richfield Company, Los Angeles, Calif.

[21] Appl. No.: 495,198

[22] Filed: May 16, 1983

[51] Int. Cl.³ .................... H01L 31/06; H01L 31/18
[52] U.S. Cl. ...................... 136/249; 29/572; 29/580; 29/583; 29/591; 136/258; 357/30
[58] Field of Search ............... 136/249 MS, 258 AM; 357/30; 29/572, 580, 583, 591; 148/1.5; 219/121 LN

[56] References Cited

U.S. PATENT DOCUMENTS

| 4,042,418 | 8/1977 | Biter | 136/249 MS |
|---|---|---|---|
| 4,278,473 | 7/1981 | Borden | 136/249 |
| 4,281,208 | 7/1981 | Kuwano et al. | 136/249 |
| 4,292,092 | 9/1981 | Hanak | 148/1.5 |
| 4,428,110 | 1/1984 | Kim | 29/572 |

FOREIGN PATENT DOCUMENTS 2095908A 10/1982 United Kingdom ........ 136/249 MS

OTHER PUBLICATIONS

W. J. Biter et al., "An Automatable Integrated Thin Film Solar Cell Array", *Conf. Record, 12th IEEE Photovoltaic Specialists Conf.* (1976), pp. 466-470.
J. J. Hanak, "Monolithic Solar Cell Panel of Amorphous Silicon", *Solar Energy*, vol. 23, pp. 145-147 (1979).

*Primary Examiner*—Aaron Weisstuch
*Attorney, Agent, or Firm*—Nilsson, Robbins, Dalgarn, Berliner, Carson & Wurst

[57] ABSTRACT

A photovoltaic device has a continuous thin film with a plurality of spaced photovoltaic regions thereon and front and back electrode portions substantially coextensive with each of the photovoltaic regions. Electrical connection between the regions is provided directly through the film itself, from each back electrode portion to the front electrode portion of an adjacent region. Thus, at least two of the photovoltaic regions are connected in series to increase the output voltage of the device.

14 Claims, 4 Drawing Figures

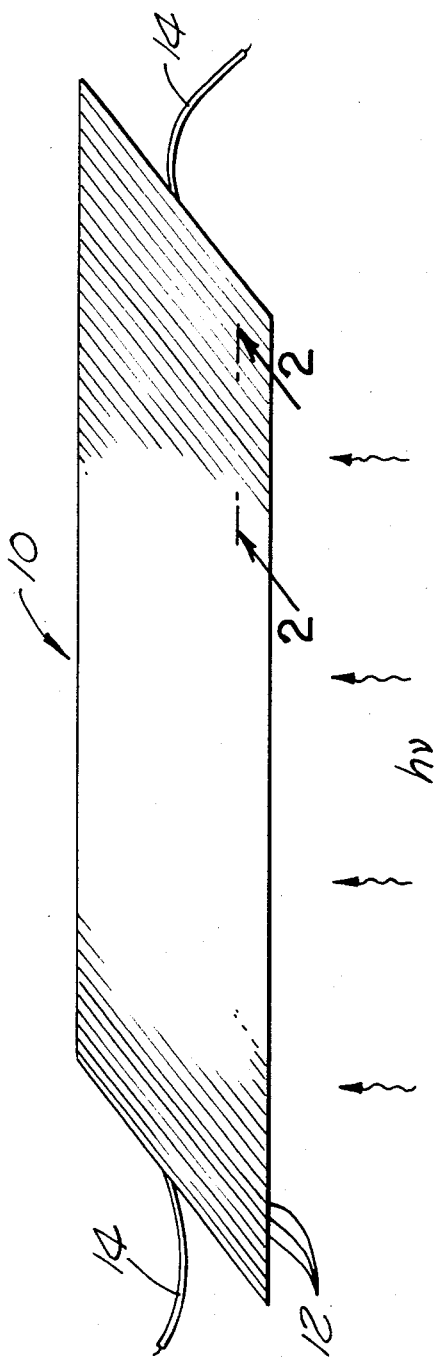
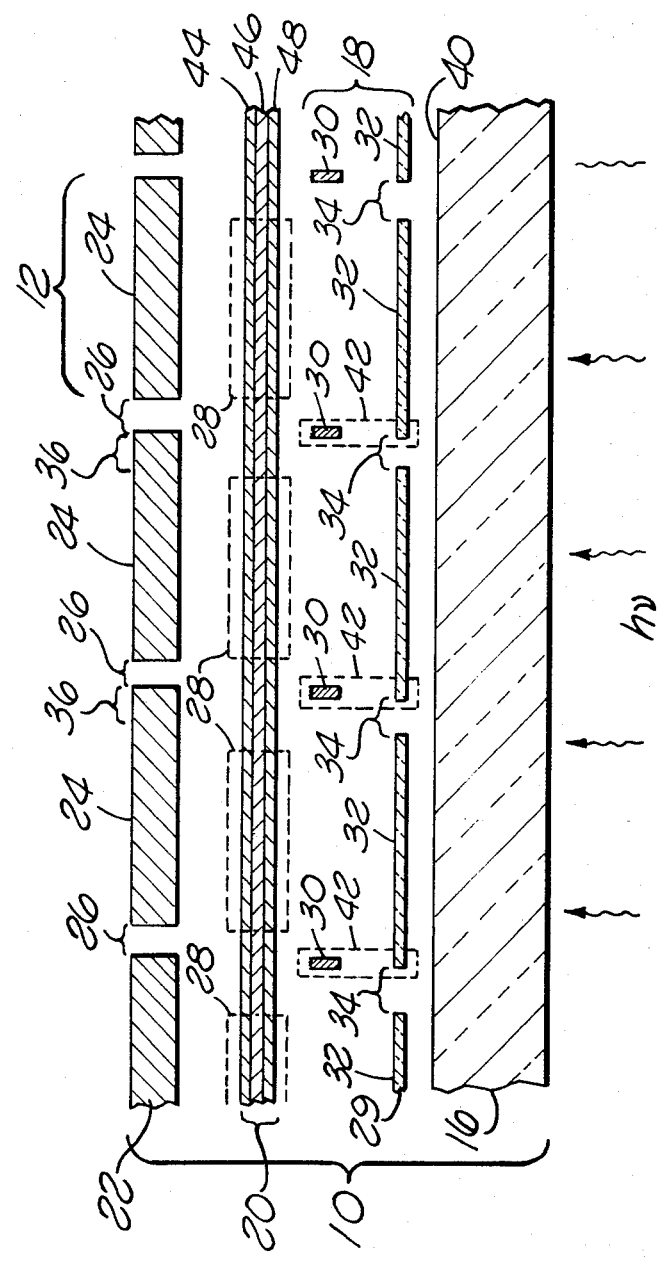

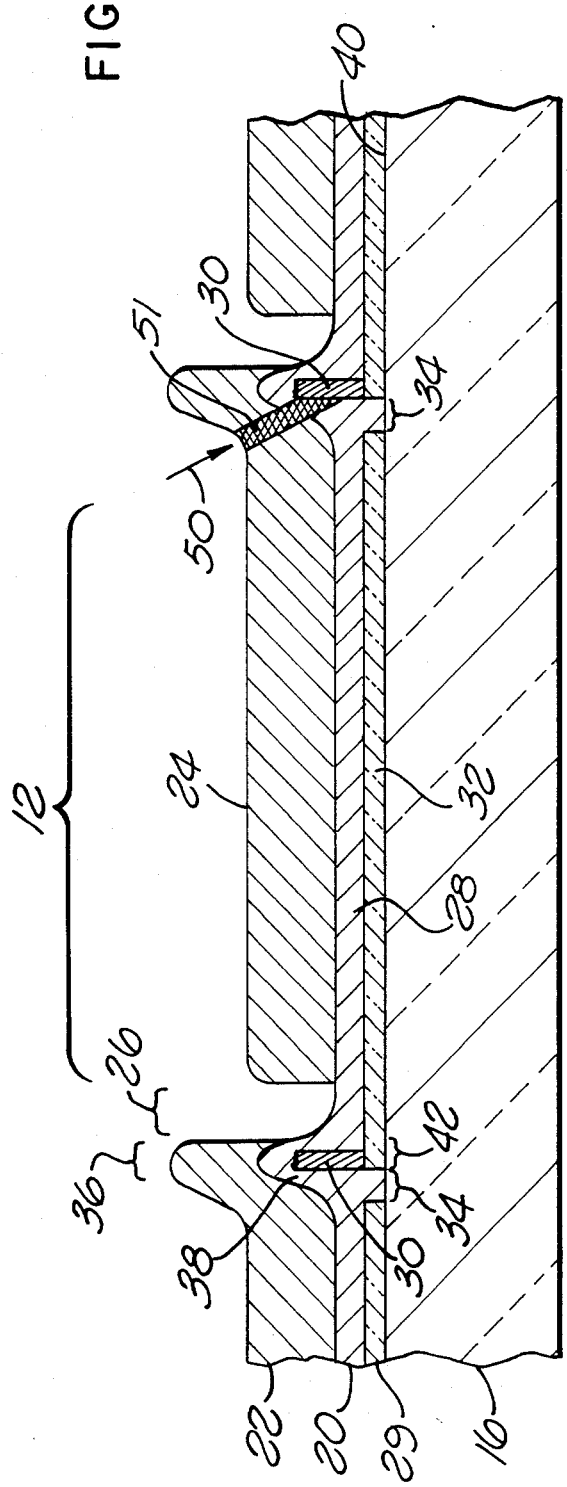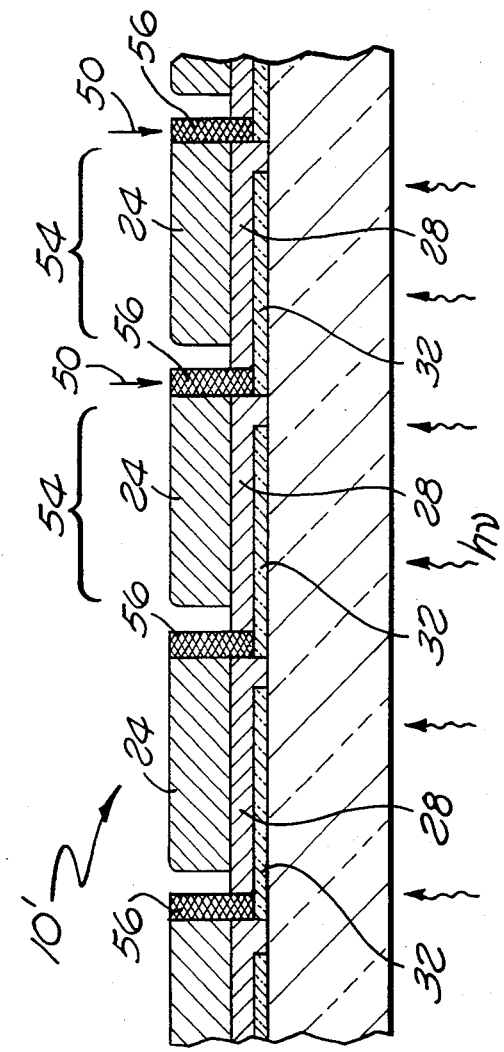

SERIES CONNECTED SOLAR CELLS AND METHOD OF FORMATION

BACKGROUND OF THE INVENTION

The present invention relates generally to the solar cell art and, more particularly, to a monolithic thin film solar cell in which a plurality of photovoltaic regions are connected in series through the film itself.

In the past, arrays of thin film solar cells have been fabricated by depositing each layer of the cells, including the photoactive layers, in preselected patterns. Alternatively, the layers have been patterned after deposition by removing portions of the layers between cells. The resulting cells are connected together externally to form solar arrays. Examples of arrays constructed in this manner are described in: Hanak "Monolithic Solar Cell Panel of Amorphous Silicon", *Solar Energy* 23: 145-147 (1979); Borden U.S. Pat. No. 4,278,473; and Hanak U.S. Pat. No. 4,292,092. Such arrays are generally rather expensive and difficult to manufacture, due largely to the steps required to pattern the photoactive layers into discrete devices. The patterning process also significantly reduces the active areas of the cells.

Another form of thin film photovoltaic device is described in Kuwano et al. U.S. Pat. No. 4,281,208, wherein one of the disclosed embodiments has an unpatterned active layer containing a number of photovoltaic regions. Electrical interconnection is made beyond the edge of the active layer. The structure is easier to manufacture than those described above, but is limited in size by the sheet resistance of its electrodes because current must be conducted to the ends of the cells where interconnection is made. The sheet resistance can severely attenuate any portion of the output signal generated at the interior of the panel, making the disclosed structure impractical for most uses. The Kuwano et al. patent also discloses another arrangement in which the active layer is patterned to permit connection at the interior of the panel.

Therefore, it is desirable in many applications to provide a thin film photovoltaic device wherein the active layer is continuous and unpatterned, yet the photovoltaic regions of the film can be easily connected in series.

SUMMARY OF THE INVENTION

The device of the present invention comprises: a continuous thin film having front and back major surfaces and a plurality of spaced photovoltaic regions thereon; transparent electrode means at the front surface having a plurality of discrete front electrode portions substantially coextensive with the respective photovoltaic regions; other electrode means at the back surface having a plurality of discrete back electrode portions substantially coextensive with the respective photovoltaic regions; and means for establishing electrical connection transversely through the thickness of the continuous film between each back electrode portion and the front electrode portion of an adjacent photovoltaic region to connect at least two of the photovoltaic regions electrically in series. In a preferred embodiment, each front electrode portion has an interconnecting portion which overlaps the back electrode portion of an adjacent region at a preselected area, each interconnecting portion comprising at least one contact portion or "stitch bar" having an irregular surface or a thickened area adjacent to the front surface of the continuous film. The required irregularity may be a roughness on a microscopic scale. In another embodiment, the electrical connection means comprises a plurality of localized conductive regions of the continuous film, which conductive regions are formed by diffusion of a conductivity inducing agent into the thin film.

The device of the present invention is a monolithic solar panel having a plurality of cells defined by spaced photovoltaic regions of a continuous active layer. Because the cells are connected transversely through the active layer itself, connection can be accomplished at any desired location without patterning the layer. A principal limitation on the manufacturing feasibility, size and shape of monolithic solar panels is therefore eliminated. Additionally, the back electrode can be deposited directly onto the deposited semiconductor surface without removing it from the processing unit for patterning. This relaxes concerns relating to contamination of the semiconductor surface before the back contact is applied.

The concept of the present invention is most useful in the case of thin film devices, such as microcrystalline thin film (MTF) photovoltaic devices, although it may also be useful in devices having polycrystalline or single crystal thin films. In this context, the term "microcrystalline" is intended to cover films loosely defined as "amorphous" in the literature. Most of such films contain microcrystalline areas, whether intentionally or unintentionally produced. Thus, it is considered more accurate to refer to all films lacking macroscopic crystallinity as being generally "microcrystalline".

The overlapping electrodes of the present invention enable connection to be made between the back of one cell and the front of an adjacent cell to connect the cells electrically in series. The stitch bars of the front electrodes either have an irregular surface near the thin film active layer or are much thicker than the layer, and the active layer is applied over them. The electrical standoff of the active layer is therefore very small near the stitch bars, resulting in a number of localized conductive paths or "short circuits" extending through the layer. Conduction can be improved even further by heating the back electrodes, either uniformly or selectively, to diffuse the electrode or other conductivity inducing material into the active layer. In each of these configurations, the flow of current through the active layer is substantially limited to a transverse flow across the thickness of the layer from one electrode portion to another. There is no appreciable current flow within the plane of the active layer because the layer has a very high sheet resistivity. Thus the cells act as discrete solar cells connected electrically in series to achieve a suitably high output voltage level.

If the stitch bar of the front electrode is not tall enough or irregular enough to short through the active layer on its own, or if the thickened stitch bar is omitted entirely, electrical connection can be achieved by localized heating of the back electrode portions in the areas of electrode overlap. The electrode material then diffuses into the film to produce a localized region of higher conductivity. This permits current to travel transversely through the active layer, as described above, but not in the plane of the active layer. Localized heating can be achieved by use of a laser, electron beam gun or other suitable means. A laser is particularly useful in producing highly localized conductive regions which do not unduly limit the active area of the cells. In some applications it may also be desirable to apply a thin strip of a conductivity inducing agent, such as phosphorous, boron, or arsenic, to the interconnect region. The agent can diffuse into the active layer on its own or in the presence of applied heat to create a conductive interconnect. The agent might, for example, be applied by a screen printing process, or by heating localized areas with a laser beam in a gaseous environment containing a suitable dopant gas. Any of these configurations permit the area of overlap and separation of the electrode portions to be minimized, yielding a highly efficient solar panel.

BRIEF DESCRIPTION OF THE DRAWINGS

The above and other features of the present invention may be more fully understood from the following detailed description, taken together with the accompanying drawings, wherein similar reference characters refer to similar elements throughout and in which:

FIG. 1 is a perspective view of a monolithic solar panel constructed according to the present invention;

FIG. 2 is a somewhat diagrammatic exploded sectional view taken along the line 2—2 of FIG. 1;

FIG. 3 is an enlarged sectional view corresponding to a portion of the structure of FIG. 2 in final form; and FIG. 4 is a fragmentary vertical sectional view of an alternative embodiment to the structure of FIGS. 2 and 3.

DESCRIPTION OF THE PREFERRED EMBODIMENTS

FIG. 1 shows a monolithic thin film solar panel 10 constructed according to a preferred embodiment of the present invention. The panel defines a plurality of elongated solar cells 12 connected electrically in series between a pair of external leads 14. The cells are shaped as narrow strips connected along opposite longitudinal edges to minimize series resistance losses. Connection between cells is accomplished directly through an unpatterned active film of the solar panel, without interrupting the film. Current generated by the cells in response to incident light (hv) travels a very short distance within each cell electrode before passing to the opposite electrode of an adjacent cell.

As seen in FIG. 2, the solar panel 10 comprises a transparent substrate 16, a transparent front electrode 18, a continuous thin film 20 of photovoltaic material and a patterned back electrode 22. The electrode 22 comprises a plurality of back electrode portions 24 separated by a spacing 26 and arranged to substantially overlie elongated photovoltaic regions 28 of the thin film. The front electrode 18 includes a transparent conductive layer 29 and a series of contact portions or "stitch bars" 30. The layer 29 is patterned to form a plurality of transparent electrode portions 32 separated by a spacing 34 and substantially underlying the respective photovoltaic regions. The photovoltaic regions are thus effectively sandwiched between the back electrode portions 24 and the front electrode portions 32 for collection of current generated within the regions. In addition, each front electrode portion partially overlaps the back electrode portion of an adjacent photovoltaic region over a preselected area 36.

A major feature of the present invention is the provision of conductive paths substantially transversely through the active thin film 20 between each front electrode portion and the back electrode portion of an adjacent photovoltaic region. Interconnection is accomplished at the area of electrode overlap to connect the photovoltaic regions electrically in series without patterning or otherwise interrupting the film.

In the embodiment 10, the stitch bars 30 are tall and narrow enough, and/or irregular enough, in comparison to the thin film 20, to electrically short through the film. Although the stitch bars are shown as being applied over the transparent layer 29, it is also possible to apply them directly to the surface of the substrate 16 as long as the subsequently applied transparent layer is in electrical contact with them. The final configuration of the solar panel 10 is illustrated best in FIG. 3, wherein the stitch bars cause the subsequently applied film 20 to be distorted in a manner producing relatively thin regions 38 which are unable to withstand the cell voltage. Electrical conduction takes place through the regions 38. It is advantageous that the stitch bars be as rough as possible at their upper surfaces to focus the applied electric field and minimize the resistance of the regions 38.

The stitch bars 30 are preferably approximately 25 microns thick, and the thin film 20 and the patterned transparent conductive layer 29 are approximately 6,000 and 2,000 angstroms thick, respectively. The thickness of the back electrode may be approximately 25 microns, if screen printed, or approximately 2 microns, if evaporated. At the locations of the stitch bars 30 in one embodiment, the film 20 is sandwiched between a pair of conductive elements at least 40 times thicker than the thickest portion of the film. The thickness ratio is even greater at the relatively thin regions 38, where the thickness of the film may be as small as 5 angstroms or less. This produces an effective short circuit through the film in the area of each stitch bar, but does not short out the cells 12 because the film 20 has a very high sheet resistance. The sheet resistance virtually eliminates current within the plane of the film, leaving only substantially transverse currents developed within the photovoltaic regions and passed between the electrodes at the areas of overlap.

Referring to FIGS. 2 and 3 in more detail, the various layers and electrode portions of the panel 10 are sequentially deposited on a major surface 40 of the substrate 16. The substrate is preferably made of glass or other suitable transparent material which is compatible with the materials of the stitch bars 30 and the transparent conductive layer 29.

The transparent conductive layer 29 is preferably a transparent conductive oxide (TCO), such as indium tin oxide (ITO), tin oxide (TO) or indium oxide (IO). A combination of layers of these materials can be used to effect chemical and/or electronic compatibility, and optimize device performance. In order to minimize contamination, it is preferable to deposit the transparent conductive layer prior to application of the stitch bars. However, the order of application can be reversed if suitable precautions are taken.

The transparent conductive layer 29 is preferably deposited, in the first instance, as a continuous layer. ITO, for example, may be deposited at approximately 300 degrees Celsius by vacuum evaporation of indium and tin in an oxygen atmosphere with glow discharge assistance. The glow discharge activates the oxygen to produce a high quality film. TO can be deposited using a chemical vapor process and IO is preferably deposited by reactive evaporation of indium in an activated oxygen atmosphere.

The thickness of the transparent conductive layer 29 is selected to minimize reflection and absorption of light by it. According to established optical principles, internal reflection losses from a transparent coating are minimized when the thickness of the coating is an odd multiple of quarter wavelengths of incident light, divided by the index of refraction of the coating. For present purposes, the relevant wavelength is that at the peak of the spectral response of the photovoltaic material making up the film 20. In the case of MTF silicon, it is approximately 5,400 angstroms, corrected to 3,000 angstroms for an index of refraction of 1.8; one-quarter wavelength is 750 angstroms and three-quarters of a wavelength is 2,250 angstroms. Although many conventional transparent conductive oxides require the larger thickness to reduce sheet resistivity to an acceptable level, the 750 angstrom thickness is desirable, if practical, to minimize absorption.

The stitch bars are preferably applied over the transparent conductive layer, either by screen printing or evaporation through a mask. In the case of screen printing, a suitable commercially available screen printing paste is forced onto the surface through a patterned screen. The paste may contain, for example, silver (Ag) powder, glass frit and a suitable organic vehicle or binder. After application to the transparent layer, the paste is fired to drive off the organic vehicle and leave the silver and glass frit behind. The glass frit is intended to fuse to the substrate, providing a strong bond, while silver metal makes the stitch bars conductive. Alternatively, a commercial screen printing paste without glass frit can be used. If the stitch bars are evaporated, they may be made of silver, aluminum or other material providing a high quality contact.

Although the stitch bars 30 are illustrated as grid lines or sections of grid lines passing through the preselected areas 36 of electrode overlap, it is not necessary that they be continuous or that they be lines at all. If the stitch bars are screen printed, they should be approximately 25 microns in height to operate satisfactorily. If evaporated, they should be about 2 microns, and preferably 10 microns, in height. In each case, the aspect ratio (height divided by width) and the roughness or surface irregularity of the stitch bars are the parameters responsible for the localized short circuit that permits the panel 10 to operate. If the width of the bars is substantial in relation to their height, or the bars are smooth rather than rough, it may be necessary to increase their height beyond the values set out above. Roughness is usually the dominant factor giving rise to the highly conductive pathways. It permits the stitch bars to act as a series of point sources of electrical potential, significantly enhancing conduction through the active layer. In some circumstances, the surface irregularity or "microroughness" resulting from the process of depositing the stitch bars can serve this purpose.

After application of the stitch bars, the transparent conductive layer 29 is patterned using conventional techniques, such as laser scribing. In the case of the panel 10, the patterning operation entails removal of the transparent conductive layer along a series of parallel lines near the stitch bars 30, yielding the front electrode portions 32 separated by spacings 34. The front electrode portions are then shaped as parallel strips corresponding generally in area to the cells 12 of FIG. 1. However, the front electrode portions 32 and the cells 12 need not be shaped as strips, as long as each front electrode portion is provided with an interconnecting portion 42 which overlaps part of the back electrode portion of an adjacent photovoltaic region. Although the layer 29 can be applied either before or after the stitch bars 30, it is preferably not patterned until after the stitch bars have been applied. The stitch bars 30 then act as a guide for patterning the layer 29.

The thin film 20 may contain any suitable photovoltaic material defining a photojunction for conversion of light to electrical energy. In the preferred embodiment, the film 20 is MTF silicon having $N^+$, I and $P^+$ layers 44, 46 and 48, respectively, as illustrated in FIG. 2. Alternatively, it may be a polycrystalline, or even single crystalline, material. In the case of MTF silicon, the film 20 is deposited by conventional glow discharge techniques without patterning or masking. The film 20 extends continuously and completely across the stitch bars 30, the transparent conductive layer 29 and the spacings 34. The thickness of the film 20, complete with all three layers of different conductivity types, is approximately 6000 angstroms. Although this dimension depends upon the material of the film 20, the stitch bars 30 must, in any case, be tall and rough, as compared to the thickness of the thin film. Otherwise, the desired conductive paths through the film will not exist.

The back electrode 22 serves as the back contact of the cells 12. It can be formed by any suitable technique, such as screen printing. In the case of screen printing, a conventional epoxy based silver/graphite material may be used to selectively apply conductive silver in the shape of the back electrode portions 24. The panel is then heated to approximately 100 degrees Celsius to cure the epoxy. Other metals, such as nickel, palladium or gold, can be substituted for silver in the back contact. In a commercial context, it is anticipated that the precious metals will be eliminated to minimize cost. A further possibility for the back electrode 22 is a molybdenum/ aluminum/molybdenum sandwich layer wherein the three materials are applied sequentially by conventional techniques. The aluminum layer provides good reflectivity for redirecting light back into the thin film, while the outer molybdenum layers ensure good electrical contact with the thin film and good laser coupling. Laser coupling is important in the embodiment described below.

Although shorting through the film 20 can be achieved in many circumstances with the structure described above, it is sometimes desirable to enhance localized conduction through the thin film 20 by applying heat to the solar panel 10. In the case in which the stitch bars 30 are relatively high, narrow and rough, such heat can cause diffusion of the back electrode material, and possibly the material of the stitch bars 30, into the semiconductive film 20. The resulting diffused region is much more conductive than the bulk of the film and enhances interconnection of the cells. The conductive metallic materials may diffuse into the film as discrete atoms or exist as particulates occupying interstitial sites within the film. In the latter case, the conductive regions of the film comprise mixtures of metallic and semiconductive particles.

When heat is applied to the panel 10 to promote electrical conduction, it is usually desirable to apply the heat only at localized areas within the preselected areas of overlap 36. Thus, the bulk of the thin film 20 is unaffected by the heat and does not experience diffusion of the metallic electrode material, while the desired level of diffusion is obtained at the area of overlap. This approach is illustrated at the right hand side of FIG. 3, wherein a laser beam 50 is directed onto the back electrode portion 24 to produce a conductive region 51 at the relatively thin region 38. The laser beam 50, which may be the output of a laser scriber, is moved laterally across the solar panel to heat the thin film along the pattern of the stitch bar 30. The heating operation causes diffusion of the metallic electrode material into the thin film 20 in the neighborhood of the region 38. The beam 50 may melt the back contact and the thin film materials to form a eutectic composition of the two at the region 51, or may simply heat the materials enough to enhance diffusion. When the back contact is aluminum and the thin film is MTF silicon, the two materials may combine to form a conductive silicide bridging the thickness of the thin film.

Although the localized application of heat is described above with regard to the laser beam 50, it will be understood that a variety of other heating techniques can be used. Such techniques include bombardment by an electron beam source or use of radiant heating wires to produce diffusion.

A further embodiment of the present invention is illustrated in FIG. 4, wherein the stitch bars 30 are eliminated in favor of localized application of heat to produce conductive regions. Thus, the monolithic solar panel 10' has a plurality of individual cells 54 connected in series by conductive regions 56. As described in relation to FIGS. 2 and 3, each of the cells 54 comprises a photovoltaic region 28 disposed between a transparent front electrode portion 32 and a back electrode portion 24. Each of the front electrode portions overlaps the back electrode portion of an adjacent cell at a preselected area, where it is joined to the back electrode portion by one of the conductive regions 56.

The various layers of the panel 10' are preferably formed in the manner described above relative to the panel 10, with the exception that the stitch bars 30 are eliminated. After the layers are in place, the laser beam 50 or other suitable means is used to heat the back electrode portion 24 and the thin film 20 at the area of overlap 36. This causes the back electrode material to diffuse into the thin film and produce conductive regions 56. The conductive regions 56 are thus formed the same way as the region 51 of FIG. 3, and have the same make-up. The only difference is that the regions 56 play a more critical role in interconnecting the solar cells in the absence of the stitch bars 30. It is therefore important that the conductive regions 56 extend downwardly as far as possible into and through the thin film 20.

The embodiment of FIG. 4 minimizes the area of the thin film which is not available to generate electrical power. While these inactive areas of the panel 10 are approximately 30 mils wide when the interconnect is patterned by screen printing, interconnect areas 3 to 5 mils or smaller can be obtained using laser or mechanical scribing techniques and no stitch bars, as shown in FIG. 4. This difference substantially reduces the loss of active area in large area solar panels. In addition, the cells can be made much narrower when the loss of area per connection is minimized. In the narrower configuration, the required thickness of the transparent conductive layer 29 is also reduced, making it feasible to use a layer one-quarter of a wavelength thick. This minimizes light losses by the transparent layer and increases the overall efficiency of the cell. It is anticipated that the cells 12 and 54 will usually be between a few millimeters and approximately two centimeters in width.

The sheet resistance of the thin film 20 is critical to prevent shorting of the cells from one location of interconnection to another. The film 20 of the present invention preferably has a resistivity greater than $10^6$ ohms per square under conditions of incident sunlight. If the film has a lower resistivity, some of the semiconductive material can be etched away adjacent to the lines of interconnection to prevent shorting. In addition, the following ranges of operative parameters are considered useful in the practice of the present invention:

| | |
|---|---|
| Width of stitch bars 30 (or region 56) | 10–2500 microns |
| Height of stitch bars 30 | 1–5000 microns |
| Thickness of photoactive film 20 | .05–100 microns |
| Thickness of back electrode 22 | 100Å–5000 microns |
| Spacings 26 and 34 (or equivalent spacings in embodiment of FIG. 4) | 1–2500 microns |

In operation, the solar panels 10 and 10' are arranged to receive incident light (hv), through the transparent substrate 16 and the front electrode 18. Light is absorbed by the photovoltaic material of the regions 28 and is transformed into an electrical current for collection by the front and back electrode portions of the cells. The voltage at the front electrode portion of one cell is applied to the back electrode portion of an adjacent cell by the shorted regions of the film 20, connecting the cells in series. The voltage across the leads 14 thus represents the sum of the voltages of the solar cells 12, producing a relatively high overall output voltage level for the panel 10.

An MTF solar module has been made according to the present invention with good results. The module was fabricated on a substrate of 7059 glass 10 centimeters square, as an array of 18 parallel strip cells. The glass substrate was cleaned first using a detergent, then a $NH_4OH/H_2O_2$ etch, followed by a water rinse. The glass was then covered with tin oxide (TO) deposited by chemical vapor deposition from a gas mixture containing tetramethyl tin, $CF_3Br$ and $O_2$. The resulting conductive oxide layer (29) had a sheet resistivity of 5 ohms per square and a light transmission in the solar spectrum of about 80 percent. The conductive layer was printed with an array of 18 parallel stitch bars (30) using a silver paste sold by Thick Film Systems under the name "Conductrox 3347" and the sample was fired at 550 degrees Celsius, leaving stitch bars approximately 0.008 inches wide. A laser was then used to scribe the TO along a line beside each stitch bar, forming groove-like spaces (34) in the TO layer. The spaces are about 0.001 inches wide to isolate the cells from one another. An additional laser scribe at the periphery of the substrate isolates the cells from TO which may extend over the edge of the glass.

The substrate was then rinsed in methanol and placed in an MTF deposition reactor to produce a p-i-n layer having the following characteristics:

| layer | thickness | composition | bandgap (eV) | dark conductivity $(\Omega\text{-cm})^{-1}$ | light conductivity $(\Omega\text{-cm})^{-1}$ |
|---|---|---|---|---|---|
| p-type | 150 Å | Si—C—B—H alloy | 2.0 | $10^{-5}$ | |

-continued

| layer | thickness | composition | bandgap (eV) | dark conductivity $(\Omega\text{-cm})^{-1}$ | light conductivity $(\Omega\text{-cm})^{-1}$ |
| --- | --- | --- | --- | --- | --- |
| intrinsic | 5000 Å | Si—H alloy | 1.74 | $10^{-9}$ | $10^{-4}$ |
| n-type | 400 Å | Si—P—H alloy | 1.8 | 10 | |

The final layer of the module, the back contact (24), was deposited by evaporation through a shadow mask to a thickness of approximately 2 microns. The mask created spaces (26) approximately 0.004 inches wide between portions of the back contact layer, yielding a total interconnect width of approximately 0.015 inches. The module was then etched in a $CF_4 + 4\%$ $O_2$ glow discharge at 100 watts for one and one-half minutes to eliminate shorting between cells caused by the conductive n-type back layer at the locations of the spaces 26.

The module produced in this way displayed the following characteristics:

$V_{OC}$: 14.3 volts
$I_{SC}$: 70.7 milliamperes (under AM-1 illumination)
Fill factor (FF): 69.3 percent
Efficiency: 7.0 percent From the above, it can be seen that there has been provided a photovoltaic device and related method of formation wherein a plurality of cells of a monolithic thin film solar panel are connected in series through a continuous photoactive film of the panel.

While certain specific embodiments of the present invention have been disclosed as typical, the invention is, of course, not limited to these particular forms, but rather is applicable broadly to all variations falling within the scope of the appended claims. For example, the cells 12 of the solar panel 10 may, if desired, be any of a large number of shapes other than the simple strip shape disclosed herein. The electrodes at each side of the cells will then be shaped similarly and will be interconnected in the manner described herein to connect at least two of the cells electrically in series.

What is claimed is:

1. A photovoltaic device comprising:
   a continuous thin film having front and back major surfaces and a plurality of spaced photovoltaic regions thereon;
   transparent electrode means at the front surface having a plurality of discrete front electrode portions formed prior to formation of the continuous film and substantially coextensive with the respective photovoltaic regions;
   other electrode means at the back surface having a plurality of discrete back electrode portions substantially coextensive with the respective photovoltaic regions;
   each front electrode portion including at least one contact portion which is substantially thicker than said film and overlaps the back electrode portion of an adjacent photovoltaic region at a preselected area to establish electrical connection with said back electrode through the continuous film.

2. The device of claim 1 wherein:
   the contact portion has a substantially irregular surface adjacent to the front surface of the continuous film.

3. The device of claim 2 wherein:
   the substantially irregular surface is rough on a microscopic scale.

4. The device of claim 1 wherein:
   the contact portions comprise conductive grid lines.

5. The device of claim 1 wherein:
   the continuous film has a plurality of conductive regions produced by localized heating of the back electrode means and the continuous film at said areas of overlap to enhance said electrical connection.

6. The device of claim 1 wherein:
   the contact portion is at least 10 microns thick.

7. The device of claim 1 wherein:
   the contact portion is applied by screen printing a paste having a powdery component.

8. The device of claim 1 wherein:
   the contact portion is approximately 25 microns thick.

9. The device of claim 8 wherein:
   the contact portion is at least 40 times thicker than the continuous film.

10. A method of manufacturing a device having a photovoltaic thin film of preselected overall thickness which defines a plurality of photovoltaic regions, comprising the steps of:
    forming a plurality of spaced apart transparent front electrode means, each having at least one contact portion substantially thicker than the overall thickness of the thin film, on a major surface of a transparent substrate;
    forming the thin film over the front electrode means and over the major surface of the substrate therebetween; and
    forming a plurality of spaced apart back electrode means on the continuous thin film, each of the back electrode means substantially overlying one of the front electrode means to define a photovoltaic region therebetween and overlapping an electrode means of an adjacent photovoltaic region at the contact portion thereof;
    such that electrical connection is established through the continuous film between each back electrode means and the contact portion that it overlaps.

11. The method of claim 10 wherein:
    the contact portions have substantially irregular upper surfaces.

12. The method of claim 10 wherein:
    the electrical connection between each back electrode means and the contact portion that it overlaps is enhanced by localized heating of the back electrode means and the continuous film at the contact portions.

13. The method of claim 12 wherein:
    the back electrode means and the continuous film are heated at the preselected locations by a laser beam.

14. The method of claim 12 wherein:
    the back electrode means and the continuous film are heated at the preselected locations by a laser beam in the presence of a dopant gas.

* * * * *